United States Patent
Allen et al.

(10) Patent No.: US 6,601,220 B1
(45) Date of Patent: Jul. 29, 2003

(54) METHOD FOR TRANSISTOR-LEVEL CALCULATION OF THE PRECHARGE TIME OF DOMINO LOGIC CIRCUITS WITH UNLOCKED EVALUATION PATHS

(75) Inventors: David Howard Allen, Rochester, MN (US); Timothy Michael Burks, Austin, TX (US); Gregory Allen Wetli, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 08/736,055

(22) Filed: Oct. 22, 1996

(51) Int. Cl.[7] .............................................. G06F 17/50
(52) U.S. Cl. .................................................. 716/4
(58) Field of Search ........................... 364/488, 489, 364/490, 491; 716/2, 4, 5, 6

(56) References Cited

U.S. PATENT DOCUMENTS

| | | | |
|---|---|---|---|
| 5,015,882 A | * 5/1991 | Houston et al. | 307/452 |
| 5,041,742 A | 8/1991 | Carbonaro | 514/249 |
| 5,210,700 A | * 5/1993 | Tom | 364/489 |
| 5,432,747 A | 7/1995 | Fuller et al. | 365/203 |
| 5,475,605 A | * 12/1995 | Lin | 364/488 |
| 5,517,136 A | 5/1996 | Harris et al. | 326/93 |
| 5,657,239 A | * 8/1997 | Grodstein et al. | 716/6 |
| 5,740,347 A | * 4/1998 | Avidan | 716/6 |
| 5,815,687 A | * 9/1998 | Masleid | 364/488 |

OTHER PUBLICATIONS

Jouppi, N. P., "Timing Analysis and Performance Improvement of MOS VLSI Designs" *IEEE Transactions on Computer–Aided Design*, 1987, vol. 6, No. 4., pp. 650–665.
Ousterhoust, J. K., "Crystal: A Timing Analyzer for NMOS VLSI Circuits", *Proc. 3rd Cal. Tech. VLSI Conf. Computer Science Press*, 1983, pp. 57–69.
Pillage, L. T., et al, "Asymptotic Waveform Evaluation for Timing Analysis", *IEEE Transactions in Computer–Aided Design*, 1990, vol. 9, No. 4, pp. 352–366.
Raghavan, V., et al., "AWE–Inspired", *IEEE Custom Integrated Circuits Conference*, 1993, pp. 18.1.1–18.1.7.

* cited by examiner

*Primary Examiner*—Matthew Smith
*Assistant Examiner*—Thuan Do
(74) *Attorney, Agent, or Firm*—Robert Carwell; Russell D. Culbertson; Shaffer & Culbertson, L.L.P.

(57) ABSTRACT

According to the present invention, a method is provided for transistor level calculation of the precharge time of a domino logic circuit. In one version of the invention, the domino logic circuit has a plurality of cascaded stages, at least one stage having an unclocked evaluation path. In this version, the method includes the steps of determining a reset time for at least one stage of the domino circuit, determining a total reset time for the stages upstream of the at least one stage, and summing the reset time of the at least one stage with the total reset time of the cascaded stages upstream of the at least one stage to determine the precharge time. In another version, the method includes the step of performing a circuit analysis of the channel connected transistors in the at least one stage having an unclocked evaluation path.

9 Claims, 6 Drawing Sheets

METHOD FOR TRANSISTOR-LEVEL CALCULATION OF THE PRECHARGE TIME OF DOMINO LOGIC CIRCUITS WITH UNLOCKED EVALUATION PATHS

TECHNICAL FIELD

This invention relates to methods for static timing analysis of integrated circuits, and more particularly, to methods for determining the precharge time of domino logic circuits.

BACKGROUND OF THE INVENTION

A wide variety of design verification tools are required to produce a working integrated circuit from a functional specification. These tools analyze different parameters of the circuit design to ensure that the circuit will properly function after it is fabricated.

One important set of verification tools are timing analysis tools which are widely used to predict the performance of modern VLSI designs. Timing analyzers may be either static or dynamic. Dynamic timing analysis provides the most detailed and accurate information obtainable concerning the performance of the circuit. This type of timing analysis is often generated through simulation of the actual circuit by circuit simulation programs which operate at the transistor level. Examples of such circuit simulation programs are SPICE, and IBM's ASTAP. These programs typically operate by solving matrix equations relating to the circuit parameters such as voltages, currents and resistances. Simulation approaches to performance analysis are pattern dependent, i.e., the possible paths and the delays depend on the state of the machine. Thus, the result of a dynamic timing analysis depends on the particular test pattern, or vector, applied to the circuit.

This type of simulation provides high accuracy, but long simulation times because, without knowing the best and worst case patterns beforehand, a large number of patterns must be simulated. In fact, the number of simulations which must be performed is proportional to $2^n$, where n is the number of inputs to the circuit under test. Thus, for circuits having a large number of inputs, dynamic timing analysis is not always practical.

Static timing analysis tools are also widely used to predict the performance of VLSI designs. Static timing analyzers are often used on very large designs for which exhaustive dynamic timing analysis is impossible. In static timing analysis, it is assumed that each signal switches independently in each machine cycle. Only the best and worst possible rising and falling times are computed for each signal in the circuit; these are often obtained in a single pass through a topologically sorted circuit. Typical static analysis methods are described in R. B. Hitchcock Sr. "Timing Verification and the Timing Analysis Program.", Proc. Design Automation Conference, pp. 594–604, (1982), Jouppi, "Timing Analysis and Performance Improvement of MOS VLSI Designs," IEEE Transactions on Computer-Aided Design, Vol. 6, No. 4 (1987) and Ousterhout, "Crystal: A Timing Analyzer for NMOS VLSI Circuits," Proc. 3rd Cal. Tech. VLSI Conf. Computer Science Press, pp. 57–69 (1983), all hereby incorporated by reference.

Figure 1:
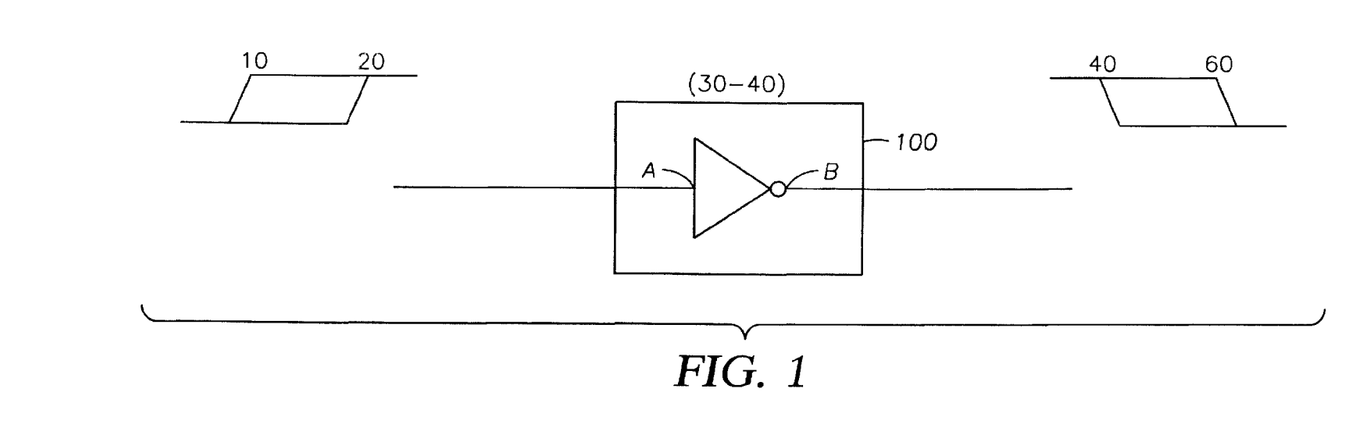
FIG. 1 is a diagram illustrating conventional static timing analysis techniques.

FIG. 1 is an example showing a static timing analysis applied to a simple one input circuit 100, namely, an inverter. Typically, cells such as the one shown in the figure are kept in cell libraries which may be used as building blocks by engineers to construct larger and more complex integrated circuits. Typically, for each cell in the cell library, a dynamic timing analysis has already been performed, and the timing parameters of the cell are maintained as part of the cell documentation. In the example shown, cell 100 is known to have a best case delay of 30 picoseconds, and a worst case delay of 40 picoseconds, for a rising edge received at input A. Thus, if it is known that a rising edge will be received at input A at some time between 10 and 20 picoseconds measured from an initial time t0, then the best case output will be a falling edge at output B at 40 picoseconds and a worst case falling edge at output B at 60 picoseconds from time t0. Thus, the performance of the circuit is described in terms of best and worst case signal transition times, and is independent of the actual pattern received at the inputs.

Transistor-level timing analyzers decompose circuits into channel connected components, i.e., non-intersecting groups of transistors that are connected by source and drain terminals to one another and to supply and ground nets. Each channel connected component can be analyzed independently to compute the worst case delays from each input to each output for both rising and falling signals. Details of delay calculation techniques are well known to those with skill in the art, and it is sufficient to note that they commonly involve tracing paths in the channel connected component from the output net to supply and ground nets to find all possible pull-up and pull-down paths. The delay of each such path is computed independently; the worst case delay for the channel connected component is the worst of each pull-up or pull-down path delay.

Although this approach works well for many logic circuits, it tends to underestimate the precharge times for domino circuits with unclocked evaluation paths because the pull-up path delay is dependent on signals supplied to the unclocked evaluation path. Underestimating the precharge time has a snow-balling effect that could lead to serious underestimation of the total power dissipation. Accordingly, it is an object of the present invention to overcome the above described problems and to provide further improvements and advantages which will become apparent in view of the following disclosure.

SUMMARY OF THE INVENTION

One aspect of the invention relates to a method for transistor-level calculation of the precharge time of a domino logic circuit having a plurality of cascaded stages, at least one stage having an unclocked evaluation path. In one embodiment, the method comprises decomposing the at least one stage into at least one channel connected component; simulating the channel connected component to determine the pull-up time of the channel connected component relative to a transition of a clock signal; determining the pull-up times of the stages excluding the at least one stage; and summing the pull-up time of the channel connected component with the pull-up times of the stages excluding the at least one stage to determine the precharge time of the domino logic circuit.

Another aspect of the invention relates to a method for determining the precharge time of a domino logic circuit having a first stage with a clocked evaluation path and a plurality of subsequent stages with unclocked evaluation paths, the first stage and the plurality of subsequent stages being responsive to a clock signal. In one embodiment, the method comprises the steps of decomposing the individual stage into a channel connected component, and simulating the channel connected component to determine the pull-up time of the channel connected component relative to a transition of a clock signal, for individual stages with unclocked evaluation paths; and summing the pull-up times of the individual stages to determine the precharge time of the domino logic circuit.

DETAILED DESCRIPTION OF EMBODIMENTS OF THE INVENTION

Figure 2:
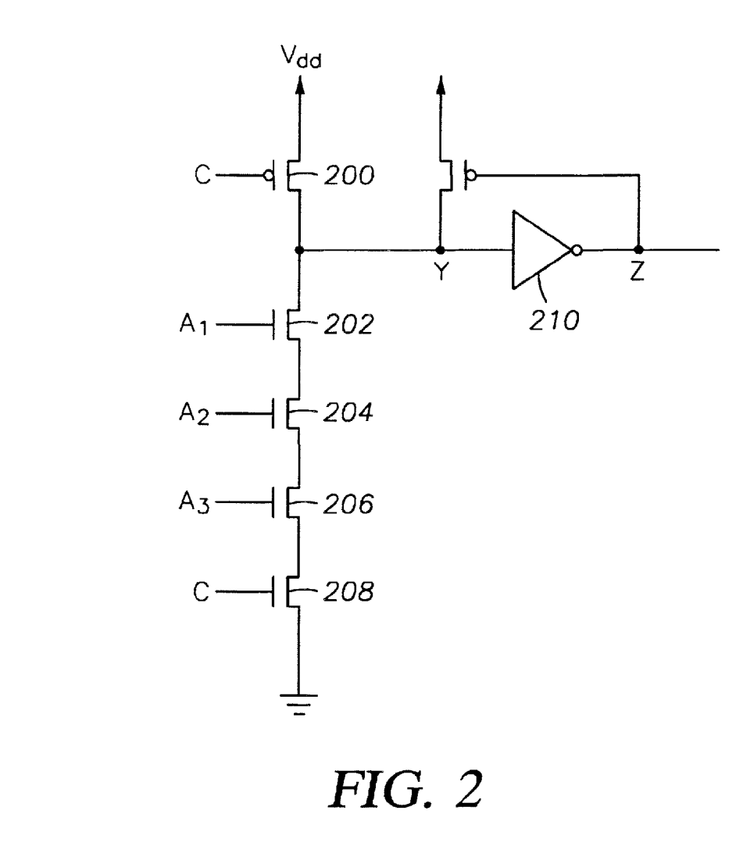
FIG. 2 is a schematic diagram of a conventional domino circuit.

FIG. 2 is a schematic diagram of a conventional domino circuit. In this case, the domino circuit is a three input AND gate having inputs $A_1$, $A_2$ and $A_3$ which operate transistors 202, 204 and 206, respectively. These transistors are connected in series with footer transistor 208 which is coupled to ground. Node Y of the circuit is pulled high by PMOS transistor 200 which is operated by clock signal C. Node Y is pulled down through a pull-down, or evaluation, path created by transistors 202, 204, 206 and 208. Footer transistor 208 is also operated by clock signal C, and serves to prevent the pull-up and pull-down paths from being in a conductive state at the same time. When the pull-up and pull-down paths are simultaneously in a conductive state, a short circuit condition is created through the circuit.

Figure 2A:
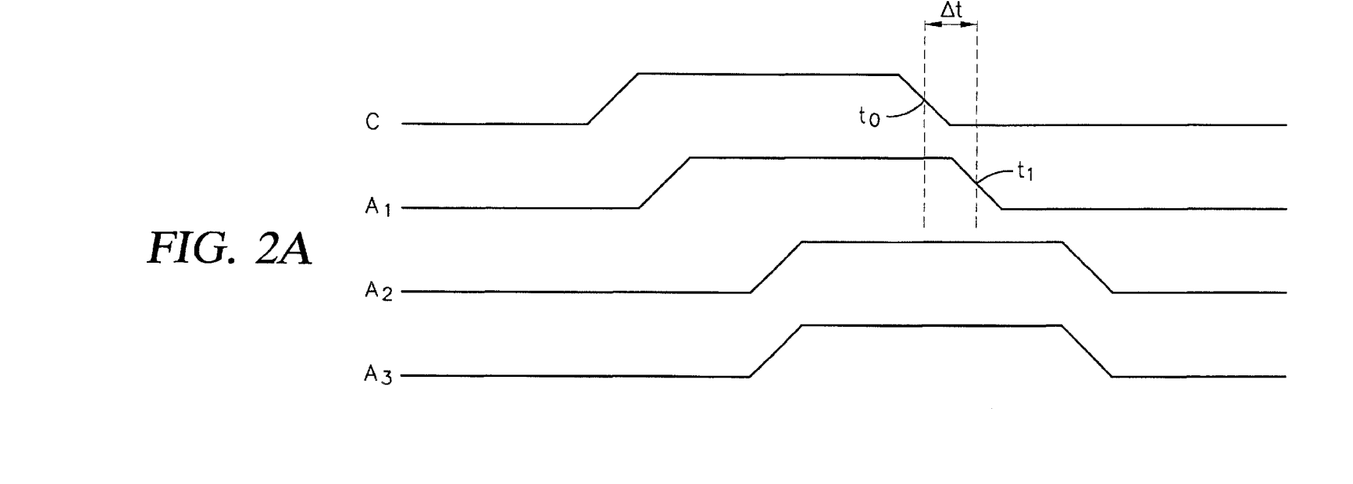
FIG. 2A is a timing diagram illustrating a set of input signals applied to the circuit shown in FIG. 2.

FIG. 2A is a timing diagram illustrating how the footer transistor 208 operates to prevent a short circuit condition. In this example, it is seen that signals $A_1$–$A_3$ remain high for a certain time period after clock signal C transitions from high to low. Specifically, the path created by transistors 202, 204 and 206 remains conducting for a time period $\Delta t$ after clock signal C transitions low, until transistor 202 turns off at time $t_1$. However, despite this overlap, the pull-down path of the circuit shown in FIG. 2 is made non-conductive at time $t_0$, because the footer transistor 208 is turned off by clock signal C.

Figure 3:
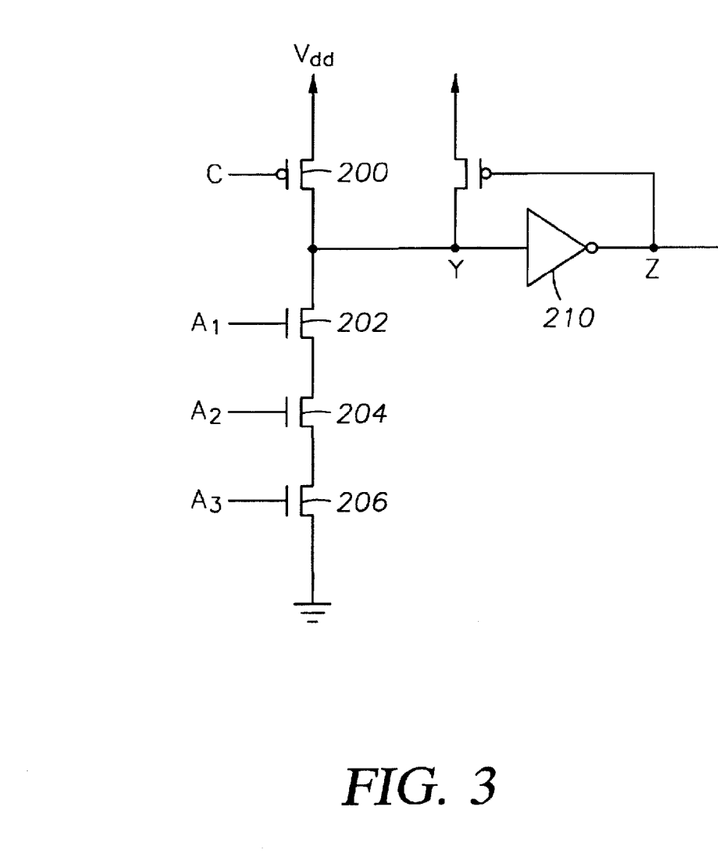
FIG. 3 is a schematic diagram of a domino circuit in which the footer device has been removed.
Figure 3A:
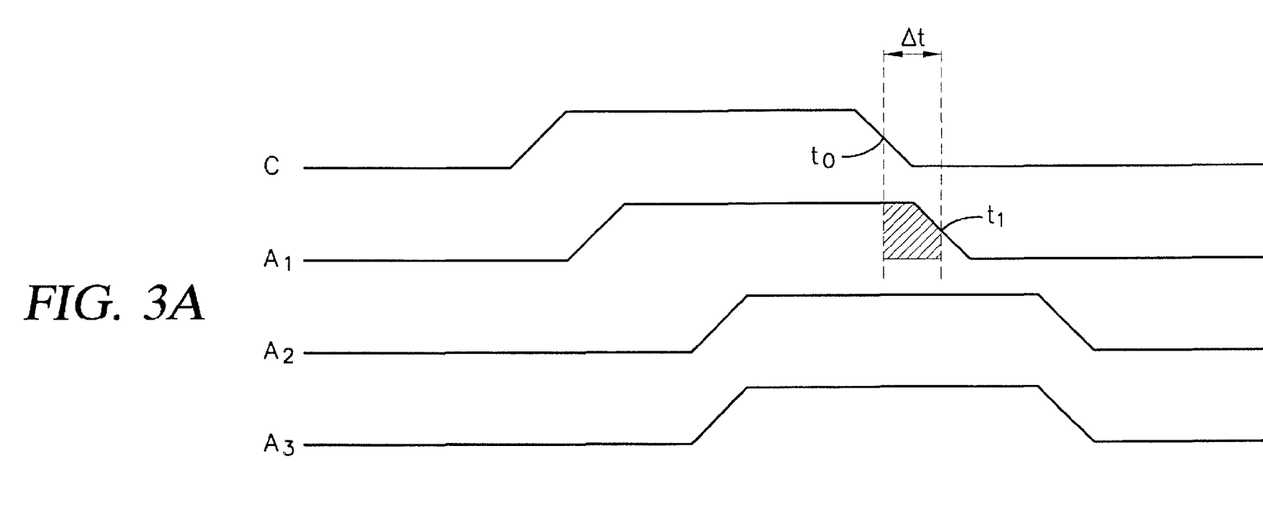
FIG. 3A is a timing diagram illustrating a set of signals applied to the circuit shown in FIG. 3.

The short circuit protection provided by footer transistor 208 comes at a price, because of the additional time required to switch the transistor. Therefore, the footer transistor is often removed from domino circuits, as illustrated in FIG. 3. FIG. 3 is a schematic diagram of a domino logic AND gate in which the footer transistor has been removed from the evaluation path. Hence, the evaluation path now comprises only transistors 202, 204 and 206. Although this provides an increase in speed, this circuit is now susceptible to short circuit conditions as illustrated in FIG. 3A. In this case, it is seen that both the pull-up and pull-down paths are conducting for a time period $\Delta t$ as indicated by the shaded area.

Although it is possible to design circuits which will tolerate a short circuit condition for small values of $\Delta t$, large values of $\Delta t$ can cause significant problems. First, since the pull-up and pull-down paths are simultaneously conductive, a large amount of current is drawn through the evaluation path to ground. This causes the circuit to consume excessive amounts of power, and may even physically damage the circuit. Second, since pull-up transistors are generally weak transistors compared to the evaluation transistors, it is possible that the output node Y may not become fully charged before clock signal C transitions from low to high. In this case, the logic value of output C may be incorrect when the circuit is evaluated.

Figure 4:
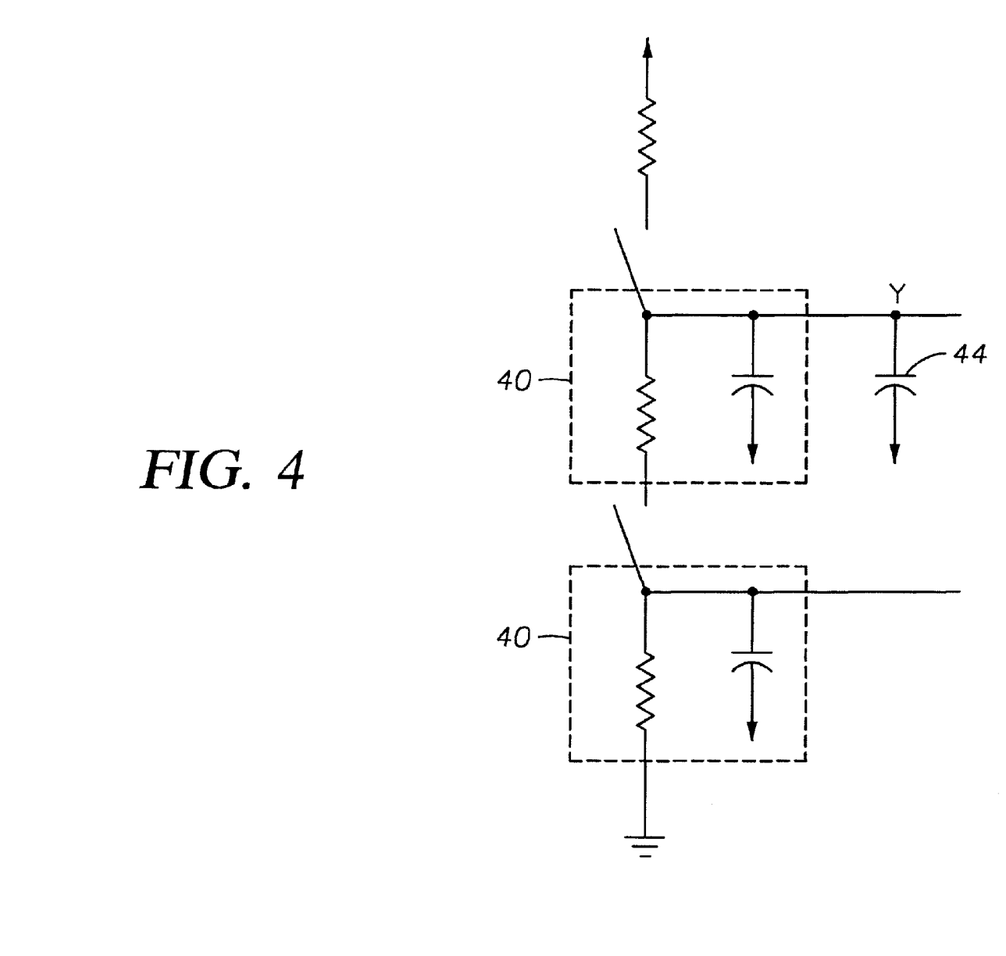
FIG. 4 is a schematic diagram of a equivalent RC model of a two transistor domino logic circuit.

Accordingly, in any static timing analysis, the precharge time of the stages must be accurately modeled and evaluated. The precise modeling method is not critical, and different modeling methods may be used with the present invention as a matter of design choice. For example, FIG. 4 is a schematic diagram of a model of a circuit having a two transistor pull-down path in which the transistors in the circuit are modeled as switched RC networks 40, 42 which drive an output Y. The capacitance of the output Y is modeled by output capacitor 44. This model treats all "on" transistors as linear resistors and all "off" transistors as open circuits. The precharge delay is computed as the step response of the resulting RC network. When the RC network is a tree, a simple measure, such as the Elmore delay can be used. For more complex circuits, or for higher order approximations, the network response can be computed using more sophisticated techniques such as Asymptotic Waveform Evaluation ("AWE"). AWE techniques are known to those of skill in the art, and typical AWE analysis is described in Pillage, "Asymptotic Waveform Evaluation for Timing Analysis," IEEE Transactions on Computer-Aided Design, Vol. 9, No. 4, pp. 352–366, (1990), and Raghavan, "AWE-Inspired," IEEE Custom Integrated Circuits Conference, pp. 18.1.1–18.1.7, (1993), both incorporated herein by reference.

Figure 5:
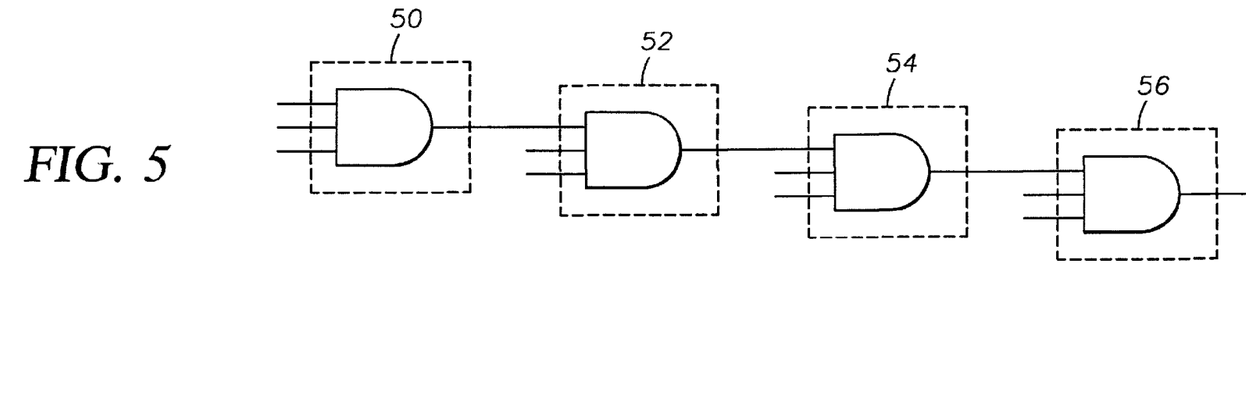
FIG. 5 is a logic diagram of a cascaded domino circuit.
Figure 6:
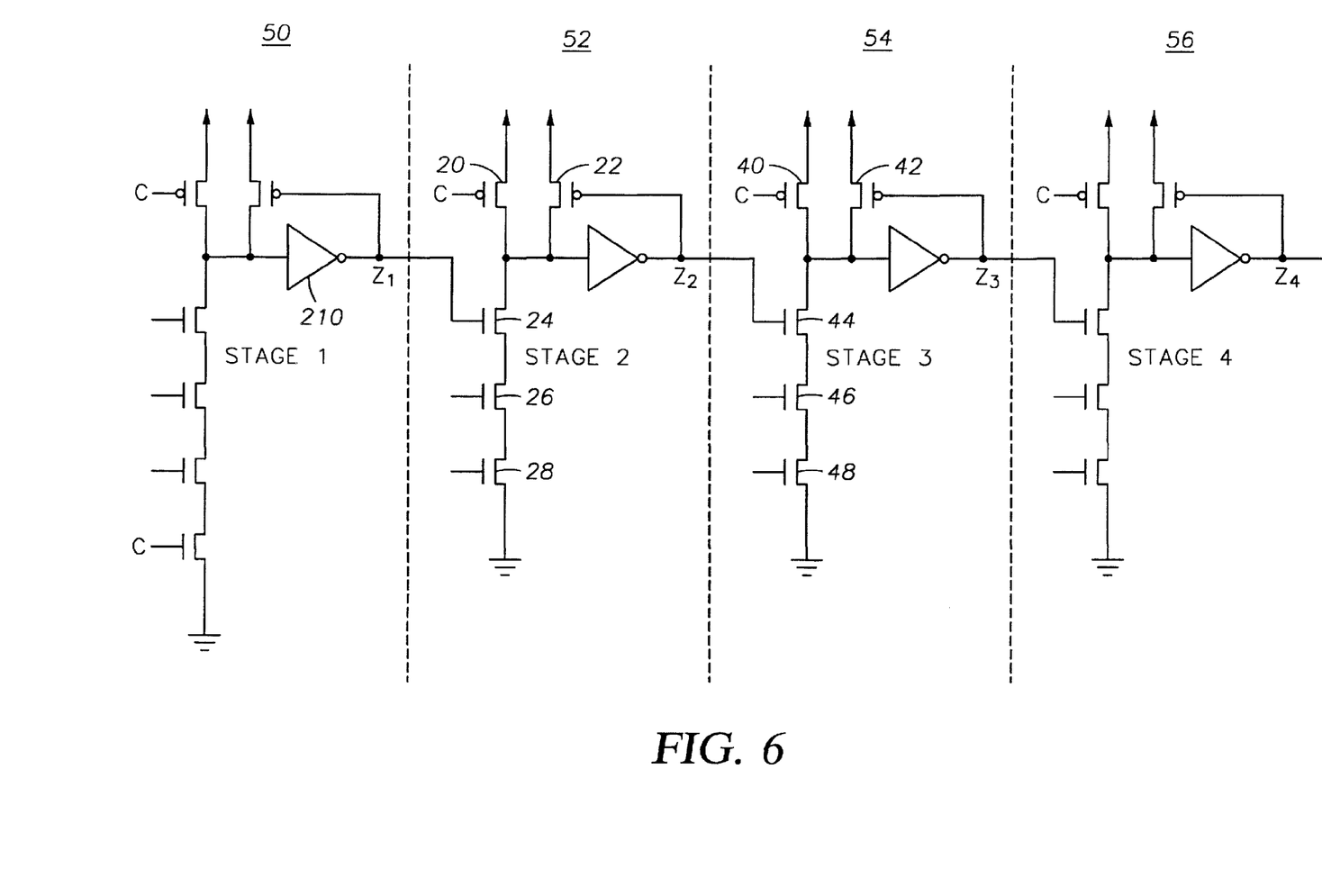
FIG. 6 is a schematic diagram of the circuit shown in FIG. 5 as implemented according to an embodiment of the invention.
Figure 6A:
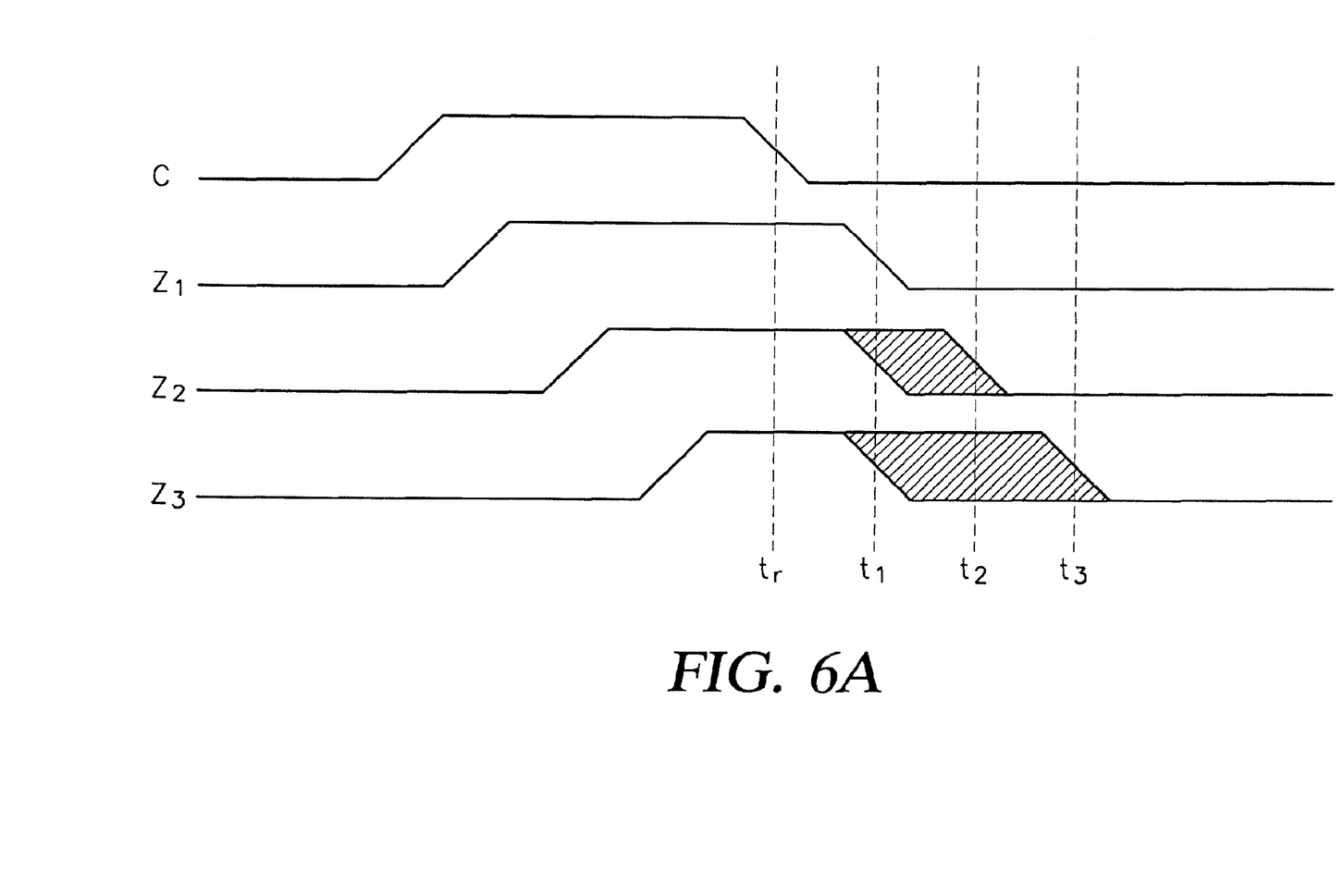
FIG. 6A is a timing diagram illustrating a set of signals input to the circuit shown in FIG. 6.

Regardless of the modeling method used, it is important that the precharge time of the domino circuits is accurately calculated by the timing analyzer. This is particularly true in cascaded circuits. FIG. 5 is a schematic diagram of a circuit comprising a plurality of cascaded AND gates 50, 52, 54 and 56. Conventionally, in the design of the circuit shown in the figure, each AND gate is a cell selected from a cell library, and various design parameters, for example the reset time, are documented. A transistor level schematic diagram of the circuit is shown in FIG. 6. In this embodiment, each AND gate is a stage in the domino circuit. AND gate 50 includes a clocked pull-down path, while the pull-down path of AND gates 52, 54, and 56 are unclocked. A common clock signal C is provided to the gate of each pull-up transistor of the AND gates and to the footer transistor in gate 50. When clock C rises, the domino logic begins evaluating, and when the clock falls, the domino gates are reset. FIG. 6A is a timing diagram illustrating the relationship between the clock signal C and the output signals of each stage of the circuit, $Z_1$, $Z_2$ and $Z_3$, respectively.

As discussed previously, the excess current and dissipated power is roughly proportional to the time during which the pull-up and pull-down paths are simultaneously conducting. In conventional static timing analysis, each conduction path is treated independently. Therefore, the reset time $\Delta t$ for each stage will be determined as a function of only the parameters associated with the pull-up path, such as the size of the precharge PMOS transistor. The pull-down path is assumed to turn off during the pull-up phase. Assuming uniform reset times, then $\Delta t_1 = \Delta t_2 = \Delta t_3 = \Delta t_4 = \Delta t$. Thus, this technique inaccurately determines that after the time period $\Delta t$, each stage of the domino circuit is precharged. This situation is illustrated by the earlier falling edges shown for signals $Z_2$ and $Z_3$, at time $t_1$.

Underestimating the precharge time of the circuit also results in underestimation of the power dissipation. Specifically, the power dissipation is proportional to the time each stage is in a short circuit condition. Since stages 2, 3 and 4 are unclocked, and the reset times are assumed to be uniform, then the power dissipated is calculated to be proportional to $\Delta t_2 + \Delta t_3 + \Delta t_4 = 3\Delta t$. This is only about half of the correct value.

The correct precharge time is calculated, according to one embodiment of the invention, by considering the reset time of the stages upstream of each stage of the domino circuit. For example, when stage 1 is pulled high during the precharge phase of the clock signal C, an evaluation signal begins to sequentially propagate through each stage of the circuit. As the evaluation signal propagates through the domino circuit, it places each pull-down path into a non-conducting state. To accurately calculate the precharge time of the circuit, the propagation delay of this evaluation signal must be taken into account. Referring to FIG. 6, it is seen that the propagation delay of the evaluation signal is related to the sum of the reset times for each stage it passes through. This is illustrated in FIG. 6A by the later falling edges of signals $Z_1$, $Z_2$ and $Z_3$. Thus, the precharge times for stages 2, 3 and 4 are $(t_1-tr)$, $(t_2-tr)$ and $(t_3-tr)$, respectively. If uniform reset delays are again assumed, then it is seen that stage 2 is in a short circuit condition for a time period $1\Delta t$, stage 3 is in a short circuit condition for a time period $2\Delta t$, and stage 4 is in a short circuit condition for a time $3\Delta t$. Thus, the actual total excess current is proportional to $(1+2+3) \Delta t = 6\Delta t$. The shaded regions in the timing diagram of FIG. 6A illustrate the additional precharge time calculated according to this embodiment of the invention.

According to a further embodiment of the invention, these delays are taken into account by performing circuit simulation on the channel connected components of the stages with unclocked evaluation paths. Methods for decomposing the stages into channel connected components are well known to those skilled in the art. Briefly, they involve grouping non-intersecting transistors that are connected by source and drain terminals to each other, and to supply and ground nets. This is described in greater detail with reference to FIG. 6. Stages 2 and 3 each contain unclocked pull-down paths. Stage 2 includes a channel connected component consisting of PMOS transistors 20 and 22 in the pull-up path, and NMOS transistors 24, 26 and 28 in the pull-down path. Similarly, stage 3 includes a channel connected component consisting of PMOS transistors 40 and 42 and NMOS transistors 44, 46 and 48.

A circuit simulation is first run on the channel connected component of stage 2. Methods for obtaining a suitable simulation generally involve performing a transient analysis of the channel connected component, and such methods are well known in the art. For example, in one embodiment, a circuit simulator, such as SPICE or ASTAP, is invoked in a sub-routine fashion from a static analysis program. Alternately, the circuit simulation is performed prior to the static analysis, and the relevant data is passed to the static analyzer.

Performing the simulation requires test patterns to be applied to channel connected components. As discussed previously, for large circuits, it is impractical to fully test all possible patterns to determine the worst case delay time. However, according to this embodiment of the invention, it is only necessary to simulate the channel connected component, which, for stage 2, contains only five transistors. Because this is such a small circuit with only a few inputs, it is entirely practical to simulate all necessary patterns to determine the worst case condition of the channel connected component. Moreover, since the pull down path will be made non-conducting at time $t_1$, regardless of the state of transistors 26 and 28, the number of patterns can be reduced even further, if desired, by ignoring the state of transistors 26 and 28 in the simulation. Alternately, a worst case pattern could be generated. using the latest falling transition time for each transistor in the pull-down path.

It is to be understood that the patterns applied to the channel connected component represent actual waveforms having logical states and relative switching times. Thus, the precharge time of stage 2 is now accurately determined as a function of the pull-up path operated by clock signal C, and the pull-down path operated by signal $Z_1$. It is assumed that since the pull-down path of stage 1 is clocked, the reset time of the stage is already known from the cell library. However, if this is not the case, then the channel connected components in stage 1 could be simulated as discussed above. In either case, the switching time $t_1$ of signal $Z_1$ is known relative to the clock signal C. These relative switching times are represented in the pattern used to simulate the channel connected components in stage 2. After simulation, the switching time of $Z_2$ will be accurately known.

Stage 3 is now simulated with a pattern which includes clock signal C and signal $Z_2$. Since the simulation of stage 2 accurately determined the time $t_2$ relative to time tr, these timing parameters are included in the pattern used to simulate stage 3. Thus, the simulation of stage 3 will accurately determine the switching time $t_3$ for signal $Z_3$. In other words, rather than treat each conduction path independently, the simulation of stage 3 will accurately take into account that the pull-down path remains on for a time $t_2-tr$ after clock signal C enters the precharge phase. Similar simulation is now performed with respect to stage 4.

The simulation for each stage thus yields a precharge time which recognizes the delay due to the precharge times of any upstream stages. Thus, the precharge times determined according to embodiments of the invention may be summed to accurately determine the total precharge time of the domino circuit. Moreover, since the precharge times were determined according worst case test patterns, they may now be used with conventional static analysis techniques to obtain accurate timing and power parameters for the domino circuit.

While the invention has been described with reference to specific preferred embodiments, it will be understood by those skilled in the art that various changes in form and detail may be made therein without departing from the sprit and scope as invention. For example, uniform reset times have been assumed in the interest of clarity. However, in other embodiments, this is not necessarily the case, the actual reset time of each stage being largely a matter of design choice. Moreover, it is clear that the short circuit condition for each stage exists only while the clock signal C is in the precharge phase and the pull-down path is conducting. In other versions of the invention, it is recognized that other evaluation signals may be applied to place a pull-down path of a stage into a non-conducting state before the evaluation signal from stage 1. This would shorten the precharge time for such stages. Thus, the embodiment discussed above is, in a sense, a worst case scenario, and in other embodiments of the invention, these additional signals are taken into account to determine more accurate precharge times and power dissipation values.

All patents, patent applications and other publications referenced herein are hereby incorporated by reference as though set forth in full.

What is claimed is:

1. A method for determining the precharge time of a domino logic circuit having a plurality of cascaded stages, at least one stage having an unclocked evaluation path, the method comprising:

decomposing the at least one stage into at least one channel connected component;

simulating the channel connected component to determine the pull-up time of the channel connected component relative to a transition of a clock signal;

determining the pull-up times of the stages excluding the at least one stage, the pull-up time for each said stage comprising the time difference between the trailing edge of an output signal from the respective stage and the trailing edge of the clock signal; and summing the pull-up time of the channel connected component with the pull-up times of the stages excluding the at least one stage to determine the precharge time of the domino logic circuit.

2. A method as in claim 1 wherein decomposing the at least one stage comprises defining the channel connected component by grouping non-intersecting transistors which are connected by source and drain terminals to one another and to supply and ground nets.

3. A method as in claim 1 wherein simulating the channel connected component comprises applying a plurality of waveforms to inputs of the channel connected component.

4. A method as in claim 1 wherein simulating the channel connected component comprises generating a worst case pattern responsive to the latest falling transition times for the transistors in the pull-down path.

5. A method for determining the precharge time of a domino logic circuit having a first stage with a clocked evaluation path and a plurality of subsequent stages with unclocked evaluation paths, the first stage and the plurality of subsequent stages being responsive to a clock signal, the method comprising:

for individual stages with unclocked evaluation paths:

decomposing the individual stage into a channel connected component, and simulating the channel connected component to determine the pull-up time of the individual stage relative to a transition of the clock signal;

determining the pull-up time of the first stage, the pull-up time of the first stage comprising the time difference between the trailing edge of an output from the first stage and the trailing edge of the clock signal; and summing the pull-up times of the individual stages to determine the precharge time of the domino logic circuit.

6. A method as in claim 5 wherein decomposing the individual stage comprises defining the channel connected component by grouping non-intersecting transistors in the individual stage which are connected by source and drain terminals to one another and to supply and ground nets.

7. A method as in claim 5 wherein simulating the channel connected component comprises applying a plurality of waveforms to inputs of the channel connected component.

8. A method as in claim 7 wherein the transition time of a waveform to be applied to an input of an evaluation path portion of a channel connected component is responsive to the pull-up times of individual stages upstream of the evaluation path portion.

9. A method as in claim 5 wherein simulating the channel connected component comprises generating a worst case pattern responsive to the latest falling transition times of the transistors in the pull-down path.

* * * * *